United States Patent
Sinsheimer

(10) Patent No.: US 12,046,787 B2
(45) Date of Patent: Jul. 23, 2024

(54) WAVEGUIDE CONNECTOR FOR CONNECTING FIRST AND SECOND WAVEGUIDES, WHERE THE CONNECTOR INCLUDES A MALE PART, A FEMALE PART AND A SELF-ALIGNMENT FEATURE AND A TEST SYSTEM FORMED THEREFROM

(71) Applicant: Teradyne, Inc., North Reading, MA (US)

(72) Inventor: Roger A. Sinsheimer, Camarillo, CA (US)

(73) Assignee: TERADYNE, INC., North Reading, MA (US)

( * ) Notice: Subject to any disclaimer, the term of this patent is extended or adjusted under 35 U.S.C. 154(b) by 428 days.

(21) Appl. No.: 17/320,825

(22) Filed: May 14, 2021

(65) Prior Publication Data

US 2022/0367997 A1  Nov. 17, 2022

(51) Int. Cl.
| | |
|---|---|
| H01P 1/04 | (2006.01) |
| G01R 1/24 | (2006.01) |
| G01R 31/66 | (2020.01) |
| H01P 5/103 | (2006.01) |

(52) U.S. Cl.
CPC .............. *H01P 1/042* (2013.01); *G01R 1/24* (2013.01); *G01R 31/66* (2020.01); *H01P 1/045* (2013.01); *H01P 5/103* (2013.01)

(58) Field of Classification Search
CPC ................................. H01P 1/042; G01R 1/24
USPC ......................................................... 333/254
See application file for complete search history.

(56) References Cited

U.S. PATENT DOCUMENTS

| | | | |
|---|---|---|---|
| 2,476,621 A * | 7/1949 | Okress | H01P 1/042 |
| | | | 285/330 |
| 5,471,148 A | 11/1995 | Sinsheimer et al. | |
| 5,528,158 A | 6/1996 | Sinsheimer et al. | |
| 6,027,346 A | 2/2000 | Sinsheimer et al. | |
| 6,107,813 A | 8/2000 | Sinsheimer et al. | |
| 6,166,553 A | 12/2000 | Sinsheimer | |

(Continued)

FOREIGN PATENT DOCUMENTS

JP   2009-060382 A   3/2009

OTHER PUBLICATIONS

International Search Report for International Application No. PCT/US2022/028048, issued Aug. 17, 2022, (3 pages).

(Continued)

*Primary Examiner* — Benny T Lee
(74) *Attorney, Agent, or Firm* — Burns & Levinson LLP

(57) ABSTRACT

An example waveguide connector is for making a blind-mate electrical connection between a first waveguide and a second waveguide. The waveguide connector includes a male part connected to the first waveguide, where the first waveguide includes a first conductive channel, and a female part connected to the second waveguide, where the second waveguide includes a second conductive channel. The female part includes a receptacle into which the male part slides to create the blind-mate electrical connection between the first conductive channel and the second conductive channel. A self-alignment feature is on at least one of the male part or the female part. The self-alignment feature is configured to guide the male part into the receptacle while correcting for misalignment of the male part and the female part.

31 Claims, 9 Drawing Sheets

(56) References Cited

U.S. PATENT DOCUMENTS

| | | |
|---|---|---|
| 6,833,696 B2 | 12/2004 | Sinsheimer et al. |
| 6,888,427 B2 | 5/2005 | Sinsheimer et al. |
| 6,963,211 B2 | 11/2005 | Sinsheimer et al. |
| 7,078,890 B2 | 7/2006 | Sinsheimer et al. |
| 7,084,656 B1 | 8/2006 | Khandros et al. |
| 7,295,024 B2 | 11/2007 | Sinsheimer |
| 7,358,754 B2 | 4/2008 | Sinsheimer et al. |
| 9,435,855 B2 | 9/2016 | Lewinnek et al. |
| 9,594,114 B2 | 3/2017 | Sinsheimer |
| 9,728,833 B2 * | 8/2017 | Okada .................. H01P 5/107 |
| 9,786,977 B2 | 10/2017 | Lyons et al. |
| 10,060,475 B2 | 8/2018 | Sinsheimer et al. |
| 10,451,652 B2 | 10/2019 | Sinsheimer et al. |
| 10,972,192 B2 | 4/2021 | Wadell et al. |
| 2002/0125971 A1 * | 9/2002 | Sciarrino ................ H01P 3/14 |
| | | 333/248 |
| 2004/0135656 A1 | 7/2004 | Sinsheimer et al. |
| 2004/0174174 A1 | 9/2004 | Sinsheimer et al. |
| 2005/0046411 A1 | 3/2005 | Sinsheimer et al. |
| 2005/0264311 A1 | 12/2005 | Sinsheimer et al. |
| 2006/0183377 A1 | 8/2006 | Sinsheimer |
| 2006/0244471 A1 | 11/2006 | Sinsheimer et al. |
| 2007/0126439 A1 | 6/2007 | Sinsheimer et al. |
| 2007/0176615 A1 | 8/2007 | Sinsheimer |
| 2008/0025012 A1 | 1/2008 | Sinsheimer |
| 2008/0030211 A1 | 2/2008 | Sinsheimer |
| 2008/0030212 A1 | 2/2008 | Sinsheimer |
| 2008/0030213 A1 | 2/2008 | Sinsheimer |
| 2008/0303613 A1 * | 12/2008 | Lau et al. ............... H01P 1/042 |
| | | 333/254 |
| 2012/0152309 A1 | 6/2012 | Miller et al. |
| 2015/0137848 A1 | 5/2015 | Lewinnek et al. |
| 2015/0256274 A1 | 9/2015 | Olgaard et al. |
| 2015/0377946 A1 | 12/2015 | Sinsheimer |
| 2016/0018442 A1 | 1/2016 | Sinsheimer et al. |
| 2016/0070072 A1 | 3/2016 | Penumatcha et al. |
| 2016/0131702 A1 | 5/2016 | Sinsheimer |
| 2016/0186804 A1 | 6/2016 | Sinsheimer et al. |
| 2017/0170537 A1 | 6/2017 | Lyons et al. |
| 2017/0285276 A1 | 10/2017 | Altshuler et al. |
| 2019/0109360 A1 | 4/2019 | Borrelli et al. |
| 2019/0165479 A1 | 5/2019 | Roos et al. |
| 2019/0349096 A1 | 11/2019 | Wadell et al. |

OTHER PUBLICATIONS

Written Opinion for International Application No. PCT/US2022/028048, issued Aug. 17, 2022, (4 pages).

Brock, D., "Blindmate RF Connector for E-Band Production Test," SW Test Workshop, Jun. 7-10, 2015, San Diego, California (17 pages).

International Preliminary Report on Patentabilty in Application No. PCT/US2022/028048 dated Nov. 23, 2023, 6 pages.

Roos Instruments, Automotive Radar, https://roos/com/automotive_radar.html (downloaded Dec. 21, 2021).

* cited by examiner

US 12,046,787 B2

WAVEGUIDE CONNECTOR FOR CONNECTING FIRST AND SECOND WAVEGUIDES, WHERE THE CONNECTOR INCLUDES A MALE PART, A FEMALE PART AND A SELF-ALIGNMENT FEATURE AND A TEST SYSTEM FORMED THEREFROM

TECHNICAL FIELD

This specification is directed to example waveguide connectors for making blind-mate electrical connections between two waveguides.

BACKGROUND

Traditional copper conductors may not be the best way to transmit high-frequency signals. Waveguides may provide for more accurate transmission of such signals over a greater frequency range. An example waveguide includes a structure that guides the transmission of energy to one direction.

SUMMARY OF THE INVENTION

An example waveguide connector is for making a blind-mate electrical connection between a first waveguide and a second waveguide. The waveguide connector includes a male part connected to the first waveguide, where the first waveguide includes a first conductive channel, and a female part connected to the second waveguide, where the second waveguide includes a second conductive channel. The female part includes a receptacle into which the male part slides to create the blind-mate electrical connection between the first conductive channel and the second conductive channel. A self-alignment feature is on at least one of the male part or the female part. The self-alignment feature is configured to guide the male part into the receptacle while correcting for misalignment of the male part and the female part. The waveguide connector may include one or more of the following features, either alone or in combination.

The waveguide connector may include a conductor between the male part and the female part to form an electrical connection between the first conductive channel and the second conductive channel. The conductor may include an electrically-conductive elastomeric material and/or a compliant spring disk. The conductor may be disk shaped and may have a central opening configured to align with the first conductive channel and the second conductive channels.

The waveguide connector may include a first conductive joint to form an electrical connection between the male part and the first waveguide, and a second conductive joint to form an electrical connection between the female part and the second waveguide. The male part may include a substantially rectangular hollow cavity to contain part of the first waveguide. The first waveguide may have a substantially rectangular cross section. The female part may include a substantially rectangular hollow cavity to contain part of the second waveguide. The second waveguide may have a substantially rectangular cross section. The male part may include a substantially circular hollow cavity to contain part of the first waveguide. The first waveguide may have a substantially circular cross section. The female part may include a substantially circular hollow cavity to contain part of the second waveguide. The second waveguide may have a substantially circular cross section.

The self-alignment feature may include an alignment feature on the male part and a guide channel on the female part. The guide channel may be configured to receive the alignment feature. The alignment feature and the guide channel may be at a shared rotational angle around a central axis such that when the guide channel receives the alignment feature, a cross section of the first waveguide is rotationally aligned with a cross section of the second waveguide. The cross-section of the first waveguide and the cross-section of the second waveguide may each be non-circular. The male part and the female part may each include a conductive material. The conductive material may include one or more of silver-plated copper or gold-plated brass. The waveguide connector may include an alignment spring connected to the female part. The alignment spring may be configured to contact the male part to cause the male part and female part to align as the blind-mate electrical connection is created. The first waveguide and the second waveguide may be flexible and configured to bend in one or more dimensions.

An example test system includes a device interface board (DIB) configured to hold devices under test (DUTs); test instruments including a radio frequency (RF) test instrument to send RF signals to one or more of the DUTs for testing; a first waveguide between the RF test instrument and the DIB; a second waveguide between the DIB and the DUT; and a connector for making a blind-mate electrical connection between the first waveguide and the second waveguide. At least part of the connector may be mounted on the DIB. The connector includes a male part connected to the first waveguide, where the first waveguide includes a first conductive channel, and a female part connected to the second waveguide, where the second waveguide includes a second conductive channel. The female part may include a receptacle into which the male part slides to create the blind-mate electrical connection between the first conductive channel and the second conductive channel. The connector also includes a self-alignment feature on at least one of the male part or the female part. The self-alignment feature is configured to guide the male part into the receptacle while correcting for misalignment of male part and the female part. The test system may include one or more of the following features, either alone or in combination.

The misalignment of the male part and the female part may include at least one of: a pitch misalignment around a central axis of the first waveguide or second waveguide, a yaw misalignment around a central axis of the first waveguide or second waveguide, or a roll misalignment around a central axis of the first waveguide or second waveguide. The system may include a test head to hold the test instruments. The DIB may be mounted to the test head. The blind-mate electrical connection may be within the test head. The first waveguide and the second waveguide may be flexible and configured to bend in one or more dimensions.

The test system may include a first coaxial cable to electrically connect the test instrument to the first waveguide and a first antenna system to perform conversion between transverse electro-magnetic (TEM) signals on the first coaxial cable and transverse electric (TE) waves on the first waveguide. The test system may include a second coaxial cable to electrically connect the DUT to the second waveguide and a second antenna system to perform conversion between TE waves on the first waveguide and TEM signals on the second coaxial cable.

The waveguide connector may include a conductor between the male part and the female part to form an electrical connection between the first conductive channel and the second conductive channel. The conductor may include an electrically-conductive elastomeric material. The conductor may be substantially disk shaped and may include a central opening configured to align with the first and second conductive channels. The conductor may include a compliant spring disk.

The test system may include a first conductive joint to form an electrical connection between the male part and the first waveguide, and a second conductive joint to form an electrical connection between the female part and the second waveguide. The male part may include a substantially rectangular hollow cavity to contain part of the first waveguide. The first waveguide may have a substantially rectangular cross section. The female part may include a substantially rectangular hollow cavity to contain part of the second waveguide. The second waveguide may have a substantially rectangular cross section.

The self-alignment feature may include an alignment feature on the male part and a guide channel on the female part. The guide channel may be configured to receive the alignment feature. The alignment feature and the guide channel may be at a shared rotational angle around a central axis such that when the guide channel receives the alignment feature, a cross section of the first waveguide is rotationally aligned with a cross section of the second waveguide. The cross-section of the first waveguide and the cross-section of the second waveguide may each be non-circular. The male part may include a substantially circular hollow cavity to contain part of the first waveguide. The first waveguide may have a substantially circular cross section. The female part may include a substantially circular hollow cavity to contain part of the second waveguide. The second waveguide may have a substantially circular cross section.

The first waveguide and second waveguide may be filled with a dielectric plastic material. The male part and the female part may include a conductive material. The conductive material may include at least one of silver-plated copper or gold-plated brass. The connector may include an alignment spring connected to the female part. The alignment spring may be configured to contact the male part to cause the male part and female part to axially align as the blind-mate electrical connection is created.

Two or more of the features described in this specification, including in this summary section, may be combined to form implementations not specifically described in this specification.

At least part of the test systems described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the systems and techniques described in this specification may be configured or controlled using a computing system comprised of one or more processing devices and memory storing instructions that are executable by the one or more processing devices to perform various control operations. The systems, techniques, components, structures and variations thereof described herein may be configured, for example through design, construction, size, shape, arrangement, placement, programming, operation, activation, deactivation, and/or control.

The details of one or more implementations are set forth in the accompanying drawings and the description below. Other features and advantages will be apparent from the description and drawings, and from the claims.

BRIEF DESCRIPTION OF THE DRAWINGS

Like reference numerals used in the detail description of the different figures indicate like elements.

DETAILED DESCRIPTION OF THE INVENTION

Figure 1:
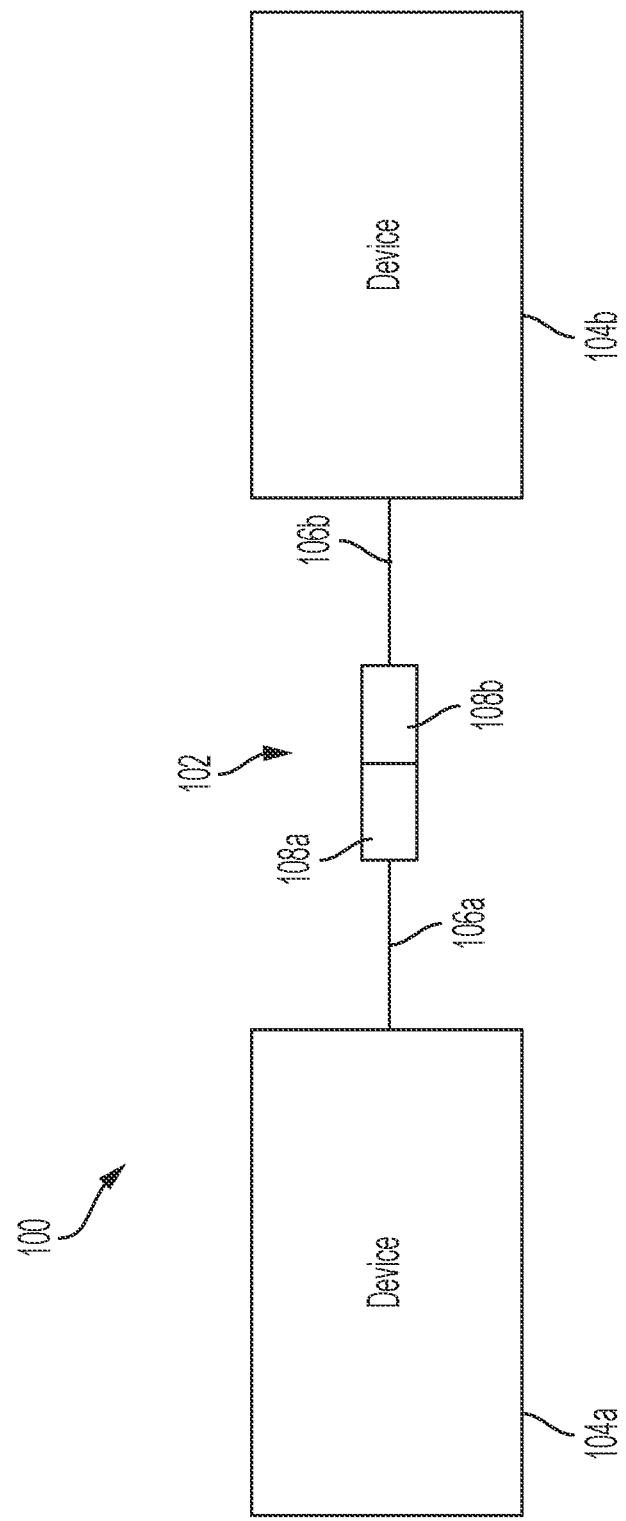
FIG. 1 is a block diagram of an example system using a waveguide connector.

An example waveguide includes a structure that restricts the transmission of energy (waves) to one direction. Described herein is an example waveguide connector and variants thereof for making a blind-mate electrical connection between two waveguides, each of which includes a conductive channel for transmission of electromagnetic waves. The waveguide connector includes a male part, referred to herein as a "plug", connected to a first one of the waveguides. The waveguide connector also includes a female part, referred to herein as a "socket", connected to a second one of the waveguides. The socket includes a receptacle into which the plug slides to create the blind-mate electrical connection between the first conductive channel and the second conductive channel. A set of self-alignment features are included on the plug, on the socket, or on both the plug and the socket. The self-alignment feature may be configured to guide the plug into the receptacle while correcting for X-Y-roll-pitch-yaw misalignment of the plug and the socket.

An example blind-mate electrical connection may be implemented using a sliding action as described above that can be implemented without use of tools in some cases. The mating of such a connection is blind in the sense that, at least in some cases, the blind-mate electrical connection has built-in tolerance that enables the connector to be mated through insertion of an entire unit or module containing the connector. Hence, individual connectors can be mated out of view of a technician. The self-alignment features included on the example waveguide connector and its variants described herein (referred to collectively as "the waveguide connector") enable blind-mating of waveguides in in this manner. Blind-mating waveguides can be advantageous in a variety of different systems including, but not limited to, test systems.

In this regard, waveguides have lower signal loss per meter than coaxial cables or other wired transmission media at certain frequencies. For example, waveguide loss may be in the low single-digit decibels (dB) per meter, whereas coaxial cable may have losses of 20 dB to 30 dB at similar frequencies. In some examples, waveguides may be configured to transmit signals at frequencies of 90 gigahertz (GHz) to 140 GHz, although the systems described herein are not limited to this frequency range. Waveguides may be used for testing high-speed electronic devices due to their low loss and high-frequency transmission range. For example, test systems configured to test radio frequency (RF) or millimeter-wave (mm-wave) devices may benefit from the use of waveguides. In this regard, in an example definition, an RF signal has a frequency range of about 20 kilohertz (KHz) to about 300 GHz. In an example definition, a mm-wave signal has a frequency range of about 30 GHz to about 300 GHz. However, the definitions of RF and mm-wave may change over time and in different jurisdictions. As such, signals labeled herein as either RF or mm-wave are not limited to the preceding numerical frequency ranges.

Incorporating blind-mate functionality into the waveguide connector may enable use of waveguides in testing situations where use of the waveguides may heretofore have been impractical. As a result, testing may incur less signal loss or other degradation, particularly in cases where the test signal source is located far from—for example, one or more meters away from—the devices under test (DUTs).

FIG. 1 is a block diagram showing an example implementation of a system 100 that that includes a waveguide connector 102, such as that described above, to convey a wave—for example, an electrical signal—between devices 104a and 104b. Connector 102 is part of a connection between first waveguide 106a and first device 104a and between second waveguide 106b and second device 104b. In an example, first device 104a may be or include a test instrument and second device 104b may be or include a DUT; however, the system of FIG. 1 is not limited to these devices. Additionally, the connection may include coaxial or other transmission media. For example, there may be a coaxial cable between each waveguide and each device. Connector 102 includes plug 108a (male part) and socket 108b (female part). Connection between waveguides 106a, 106b is completed once the plug and socket electrically and physically connect.

Figure 2:
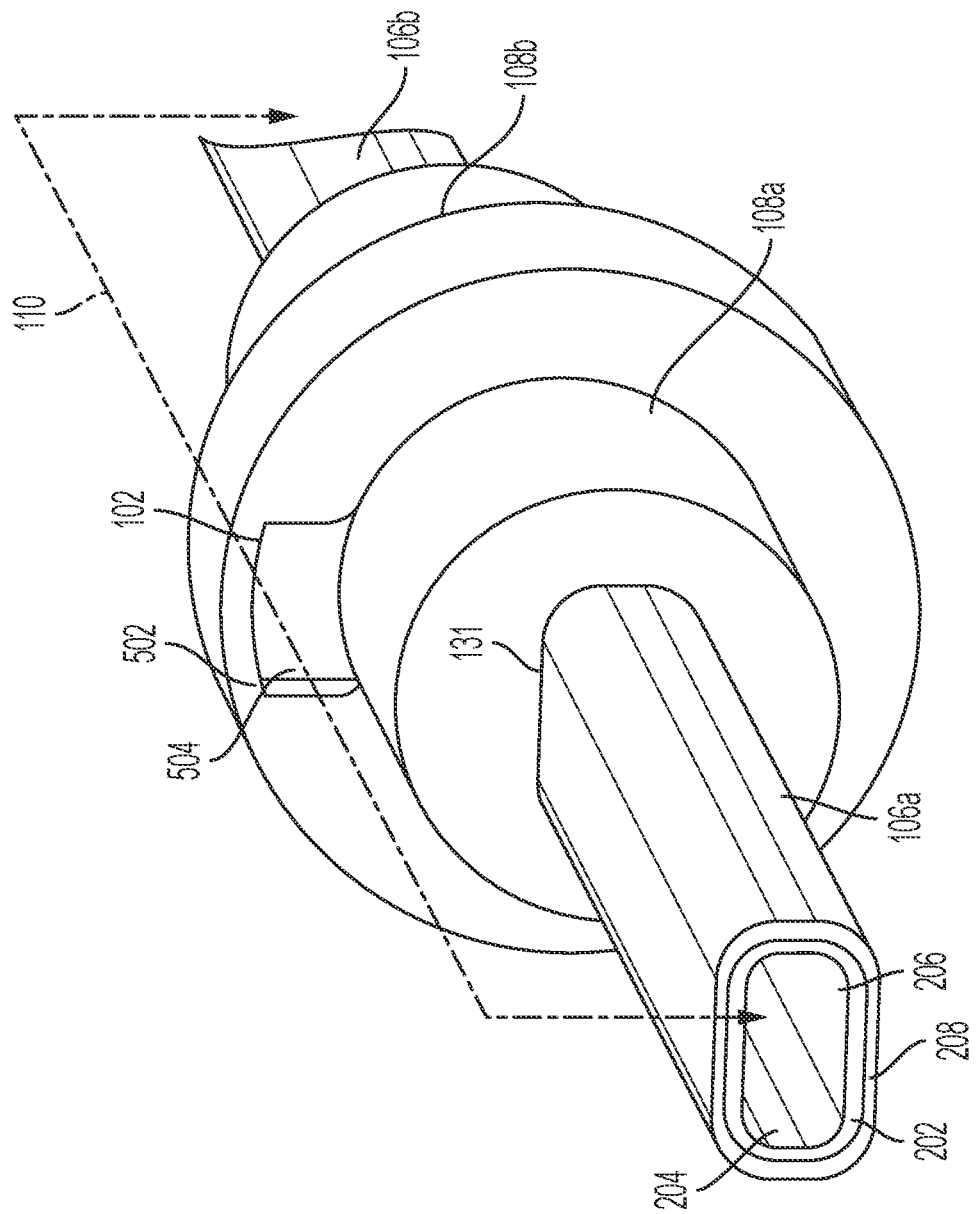
FIG. 2 is a perspective view of an example waveguide connector.
Figure 3:
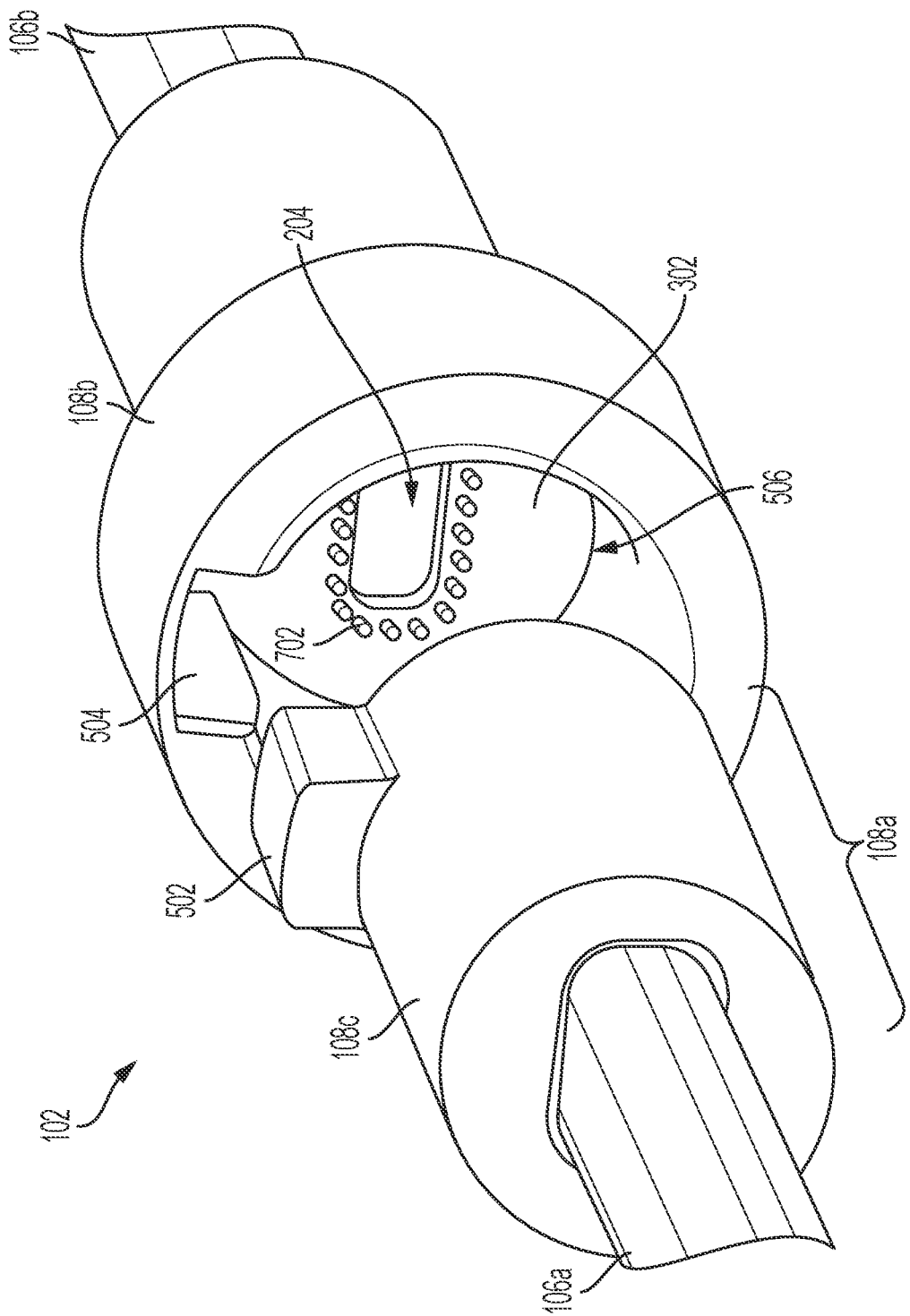
FIG. 3 is a perspective view of the example waveguide connector showing parts thereof—the socket and plug—disconnected.

FIG. 2 shows an example implementation of waveguide connector 102. Waveguide connector 102 includes plug 108a and socket 108b, which mate to form an electrical connection between first and second waveguides 106a, 106b. Plug 108a and socket 108b each include a self-alignment feature having complementary shapes for forming a blind mate connection. Referring also to FIG. 3, the self-alignment feature of plug 108a includes a rectangular protrusion 502. In this example, the self-alignment feature of socket 108b includes a guide channel 504 for receiving rectangular protrusion 502 when plug 108a and socket 108b connect. In this regard, when plug 108a is connected to socket 108b, connector 102 creates an electrical connection between waveguides 106a and 106b. This electrical connection enables electrical signals, which are transmitted as waves, to move between waveguide 106a and waveguide 106b. To this end, as described below, plug 108a and socket 108b both include electrically-conductive material to support the electrical connection between the waveguides 106a, 106b, when connected. For example, plug 108a and socket 108b may each be formed, in whole or in part, from an electrically-conductive material, such as silver-plated copper or gold-plated brass.

As shown in FIG. 3, plug 108a is configured—for example, sized and shaped—to fit within socket 108b. Socket 108b includes a receptacle 506 or "main channel" configured to receive main portion 108c of plug 108a and guide channel 504 configured to receive rectangular protrusion 502 on main portion 108c. In this example, rectangular protrusion 502 and guide channel 504 are the roll axis self-alignment features of waveguide connector 102 as noted. In this regard, guide channel 504 is configured to receive rectangular protrusion 502 when parts 108a, 108b are rotationally and axially aligned, as shown in FIG. 2.

Rectangular protrusion 502 and guide channel 504 may be configured—for example, sized and shaped—with a tolerance such that an exact fit is not required to connect the two. For example, rectangular protrusion 502 and guide channel 504 may have slightly rounded edges and/or angled edges at their point of connection, which may allow rectangular protrusion 502 and guide channel 504 to mate absent precise axial and rotational alignment. In another example, guide channel 504 might be slightly larger than rectangular protrusion 502, which may allow rectangular protrusion 502 and guide channel 504 to mate absent precise axial and rotational alignment. In some examples, combinations of such features allow for mating when the plug and socket are rotationally and/or axially misaligned by 1% or more, 2% or more, 3% or more, 4% or more, or 5% or more.

In this regard, misalignments, for example in yaw, pitch, or roll degrees of freedom, may be automatically corrected for during the connection process by the features of connector 102 described herein. The correction of any misalignments between the connector parts 108a, 108b, in turn, ensures that the waveguides 106a, 106b are properly aligned and connected after the plug 108a and socket 108b are mated, as discussed in more detail herein. The ability to form a blind mate connection between the waveguides 106a, 106b can be particularly advantageous when connections between many waveguides are used, such as where numerous waveguide connections are being made between two devices.

Figure 4:
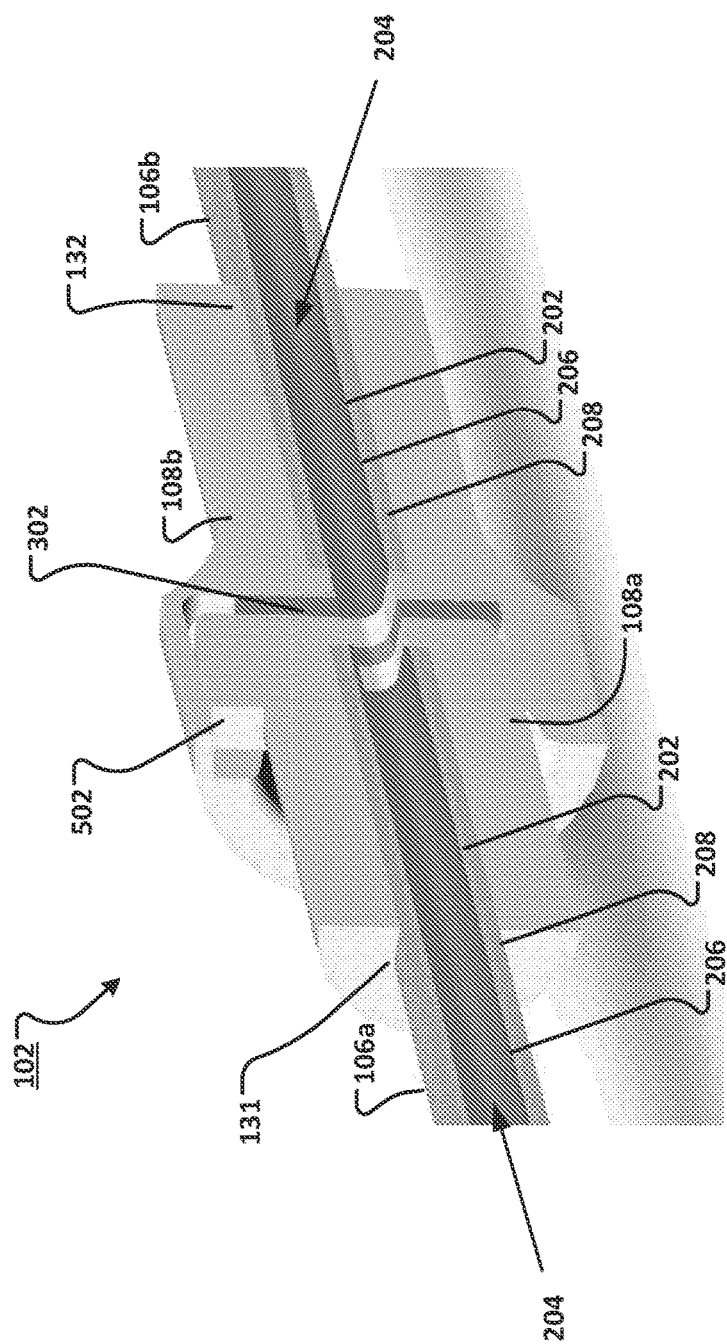
FIG. 4 is a cross-sectional view of another example waveguide connector.
Figure 5:
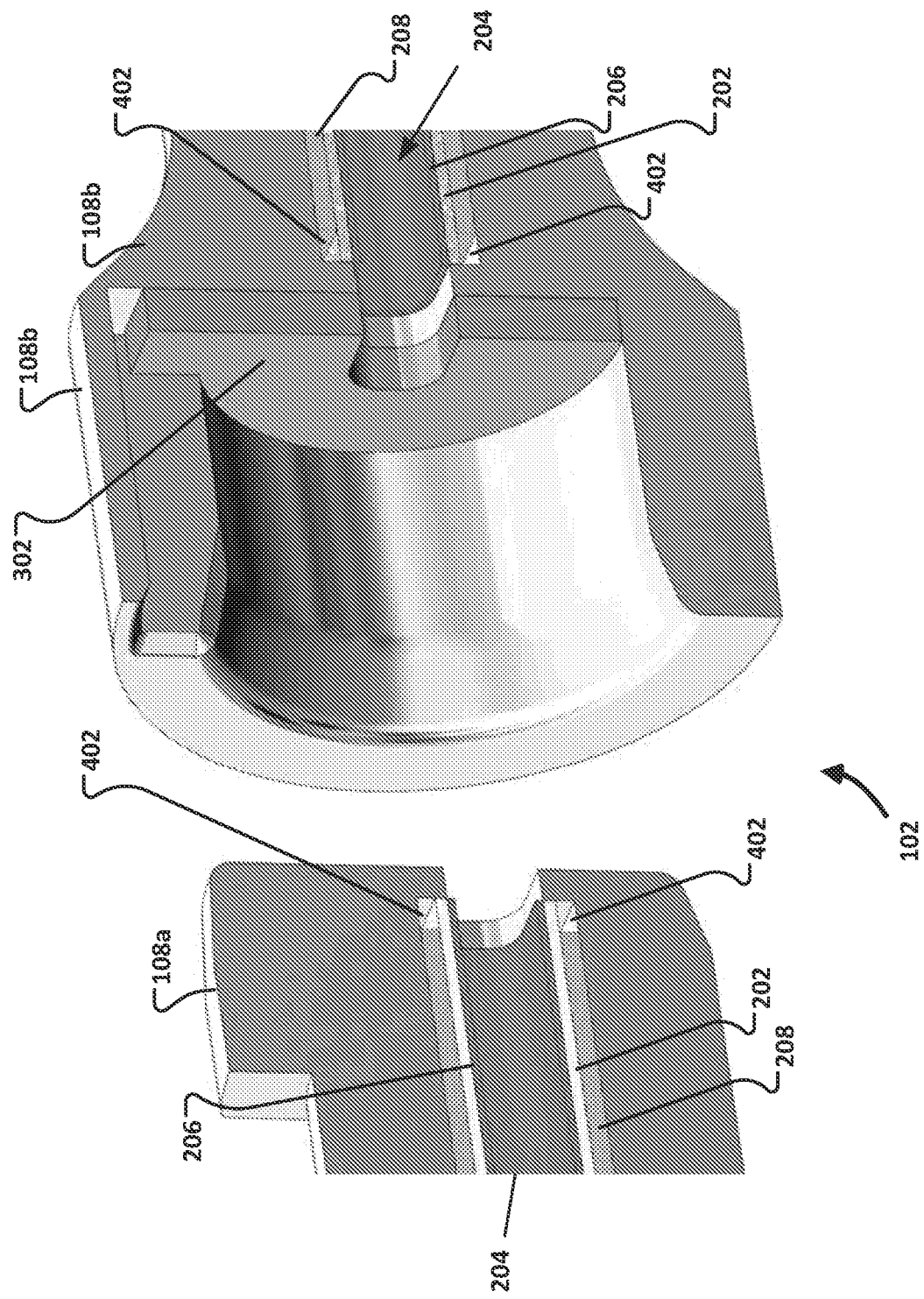
FIG. 5 is a cross-sectional view of the waveguide connector of FIG. 3 in which the socket and plug thereof are not connected.

FIG. 4 shows a vertical cross-section of a different implementation of connector 102 along line 110 of FIG. 2. FIG. 5 shows a perspective cross-sectional view of waveguide connector 102 in which the plug and socket and, therefore, the waveguides, are disconnected. In the example of FIGS. 4 and 5, each waveguide 106a and 106b includes multiple layers as depicted in FIG. 4. Waveguides 106a and 106b each include a conductive channel 202. Conductive channel 202 may be made of, or include, an electrically conductive material such as copper. Conductive channel 202 also includes a dielectric material 204, such as air, that wholly or partially fills the conductive channel. An inner liner 206 is located on an interior surface of conductive channel 202 between conductive channel and dielectric material 204. An exterior wrap 208 is on an exterior of conductive channel 202 to protect the conductive channel. In some examples, inner liner 206 and exterior wrap 208 can be or include dielectric materials, such as plastic. In some examples, in place of liner 206 there is a solid construct which conductive channel 202 is wrapped around. In that configuration, the solid construct may be made of a very low loss tangent material, for example ePTFE (Expanded polytetrafluoroethylene).

As shown in FIGS. 2 and 4, first waveguide 106a fits within a centrally-located hollow cavity 131 of plug 108a. Second waveguide 106b fits within a centrally-located hollow cavity 132 (FIG. 4) of socket 108b. As described, socket 108b is configured to receive plug 108a, thereby aligning and electrically coupling waveguides 106a and 106b. As shown in FIG. 4, connector 102 includes a conductor 302—for example, an electrically-conductive elastomeric material—that electrically couples conductive channels 202 to support and/or create the electrical connection between waveguides 106a and 106b (conductor 302 replaces springs 702 of FIG. 3). In some implementations, a portion of plug 108a is positioned between conductive channel 202 of the first waveguide 106a and the conductor, while a portion of socket 108b is positioned between conductive channel 202 of second waveguide 106b and the conductor 302. Additionally, or alternatively, as shown in FIG. 5, plug 108a and socket 108b may include pockets 402 adjacent to respective waveguides 106a and 106b. Pockets 402 are along the perimeter of conductive channels 202. Pockets 402 can be filled with a conductive paste or solder to support and/or create the electrical connection between conductive channels 202 and conductor 302. For example, a solder preform or solder paste may be introduced into pocket 402 (FIG. 5) and may be heated to melting. After the heated solder has cooled, the resulting structure will form a permanent electrically-conductive joint. In this way, conductive channels 202 are electrically connected together, allowing a wave to be transmitted across connector 102 between waveguides 106a and 106b.

Figure 6:
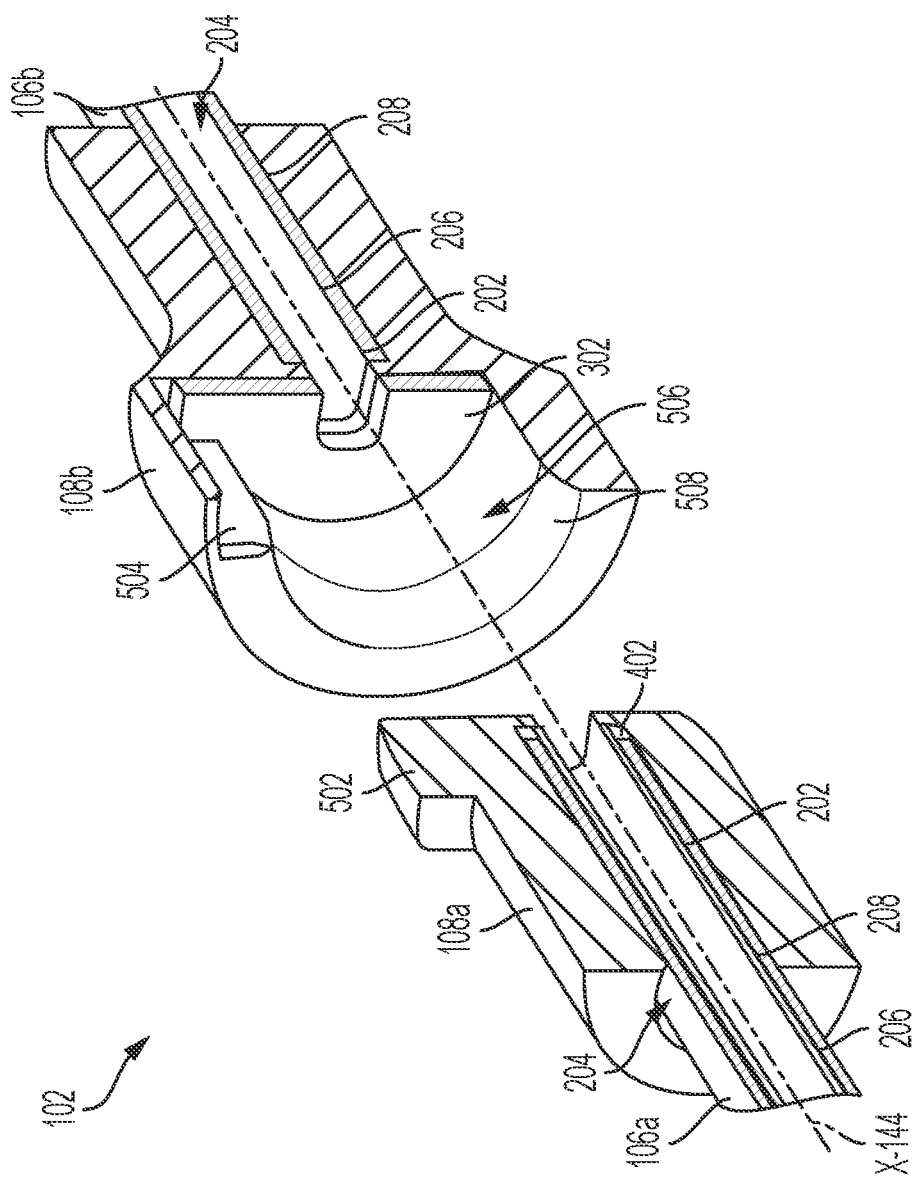
FIG. 6 is a cross-sectional view of the waveguide connector of FIG. 3 showing the socket and plug thereof fully separated axially.
Figure 7:
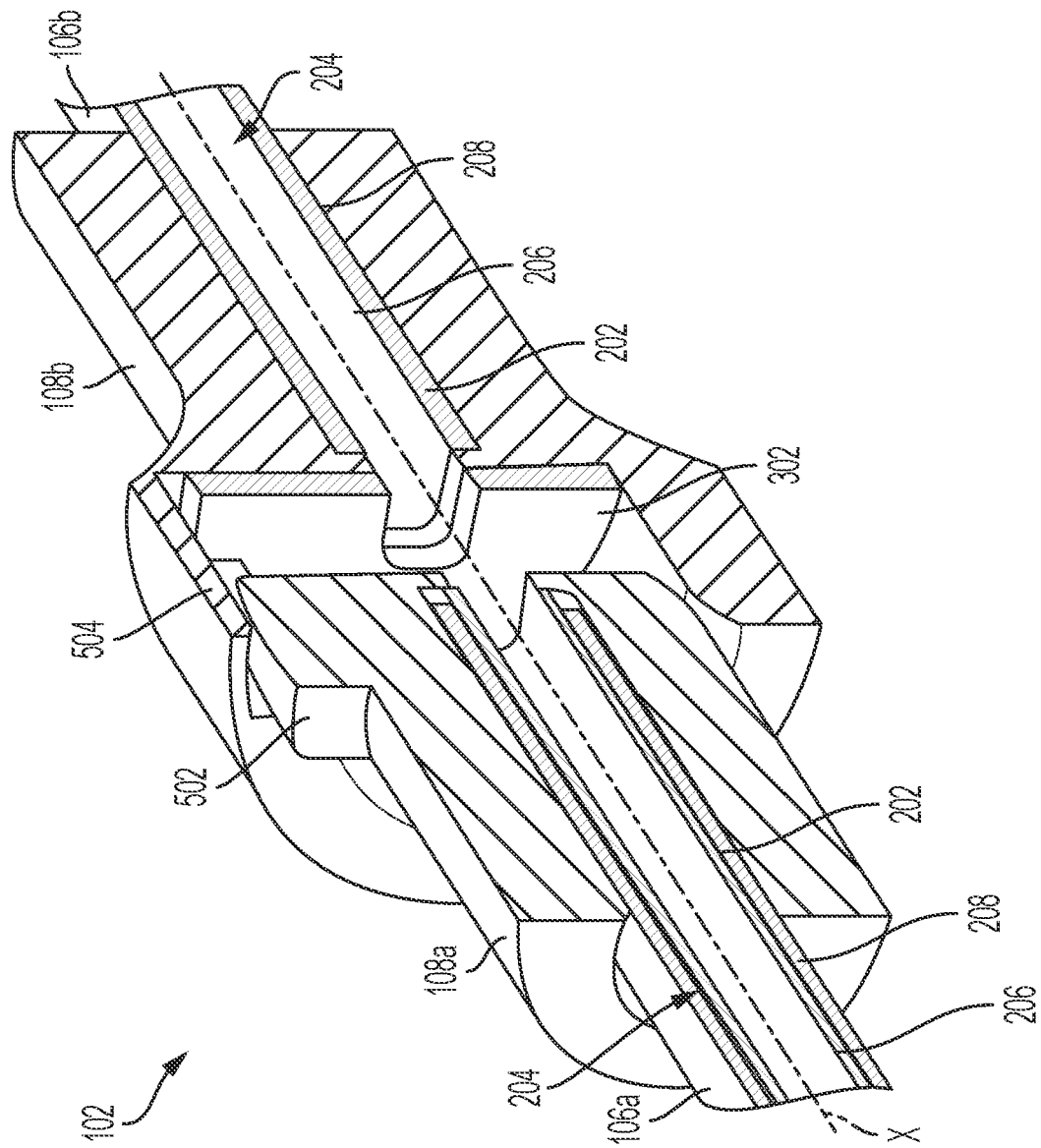
FIG. 7 is a cross-sectional view of the waveguide connector of FIG. 3 showing the socket and plug thereof partially connected.

FIGS. 6 and 7 show cross-sections of connector 102 when connecting waveguides 106 by sliding plug 108a into socket 108b. FIG. 6 depicts connector 102 at a point where waveguides 106a and 106b are completely separated. FIG. 7 depicts connector 102 with plug 108a partly inside socket 108b, but before the connection has been completed. The final, completed connection between waveguides 106a and 106b is shown in FIGS. 2 and 4. Socket 108b includes receptacle 506 (FIG. 6) configured—for example, sized and shaped—to receive the cylindrical end of plug 108a. The end of the socket 108b can include sloped edges 508 (FIG. 6) which may assist in directing the end of plug 108a into the receptacle 506, acting to align the parts. The end of the plug 108a also includes a self-alignment feature 502, or tab, that is configured to be received within the interior of guide channel 504 formed by the end of the socket 108b. As explained previously, guide channel 504 functions as a self-alignment feature. In general, the self-alignment feature 502 and guide channel 504 are positioned at a shared rotational position of respective parts 108a, 108b. When a connection is to be implemented, plug 108a and socket 108b may be moved axially—for example, along X-axis 144—toward each other. In some implementations, during connection only one of the plug or socket may be moved.

In some implementations, conductor 302 between the waveguides may be a disk-shaped conductive structure as shown having a central opening positioned around the center of waveguides 106a, 106b. Conductor 302 may be initially fixed to a surface within receptacle 506 of the end of socket 108b. Fixing conductor 302 to socket 108b results in conductor 302 being positioned between waveguides 106a, 106b as the plug and socket are joined.

In some implementations, the waveguides used with connector 102 may have a circular cross-section. In the examples shown in the figures, waveguides 106a and 106b have a substantially rectangular cross-section. In these examples, waveguides 106a and 106b are connected in such a way that waveguides 106a and 106b are rotationally aligned—for example, at a shared rotational position around the central lengthwise axis X (FIG. 6). To accomplish this, alignment feature 502 and guide channel 504 are at the same rotational position around the central axis X during connection. Accordingly alignment feature 502 protrudes from the outer circumference of the end of plug 108a, and is too wide to be received within the receptacle 506 unless alignment feature 502 is rotationally aligned with the cutout formed by guide channel 504.

During the connection process, as plug 108a and socket 108b come together, plug 108a and socket 108b can be rotated with respect to one another until guide channel 504 receives the feature 502, at which point the waveguides 106a, 106b will be properly rotationally aligned and socket 108b will receive plug 108a. Waveguides 106a, 106b are likewise at a shared rotational position, such that when alignment feature 502 and guide channel 504 are rotationally aligned, waveguides 106a, 106b will likewise be rotationally aligned. Connection in this manner may ensure alignment between the waveguides 106 after the plug 108a and socket 108b connect. In some examples, waveguides 106 can be flexible, bending in one or more dimensions to allow for easy manipulation during the connection process.

In an example, as plug 108a and socket 108b are pressed together, axial rotation of the plug 108a and socket 108b causes a blind mating between plug 108a and socket 108b as protrusion 502 is received by the guide channel 504. At that point, plug 108a and socket 108b are physically connected together, as discussed above, and the waveguides 106a and 106b will align even if their cross sections are non-circular. Protrusion 502 positioned within the guide channel 504 also prevents any roll misalignment around the central axis X after a connection is formed. Furthermore, once connected, the end of the plug 108a is firmly seated within the cylindrical receptacle 506 of socket 108b to prevent any pitch or yaw misalignment.

Referring again to FIG. 3, in some implementations, waveguide connector 102 may include a number of springs 702. Springs 702 are an alternative way of creating a required electrical path between 108a and 108b. In this example, springs 702 are flexible and engage the end of plug 108a during connection. Therefore, to the extent there is any small pitch or yaw misalignment even after the parts 108a, 108b are mated, the springs 702 will allow for an electrical connection to be completed around an entire exterior of the waveguides 106a, 106b. In this regard, the configuration creates an electrical path that is as continuous as possible path between conductive channel 202 in 106a and conductive channel 202 in 106b (see FIG. 7). Any disturbance in that path may result in signal loss.

Figure 8:
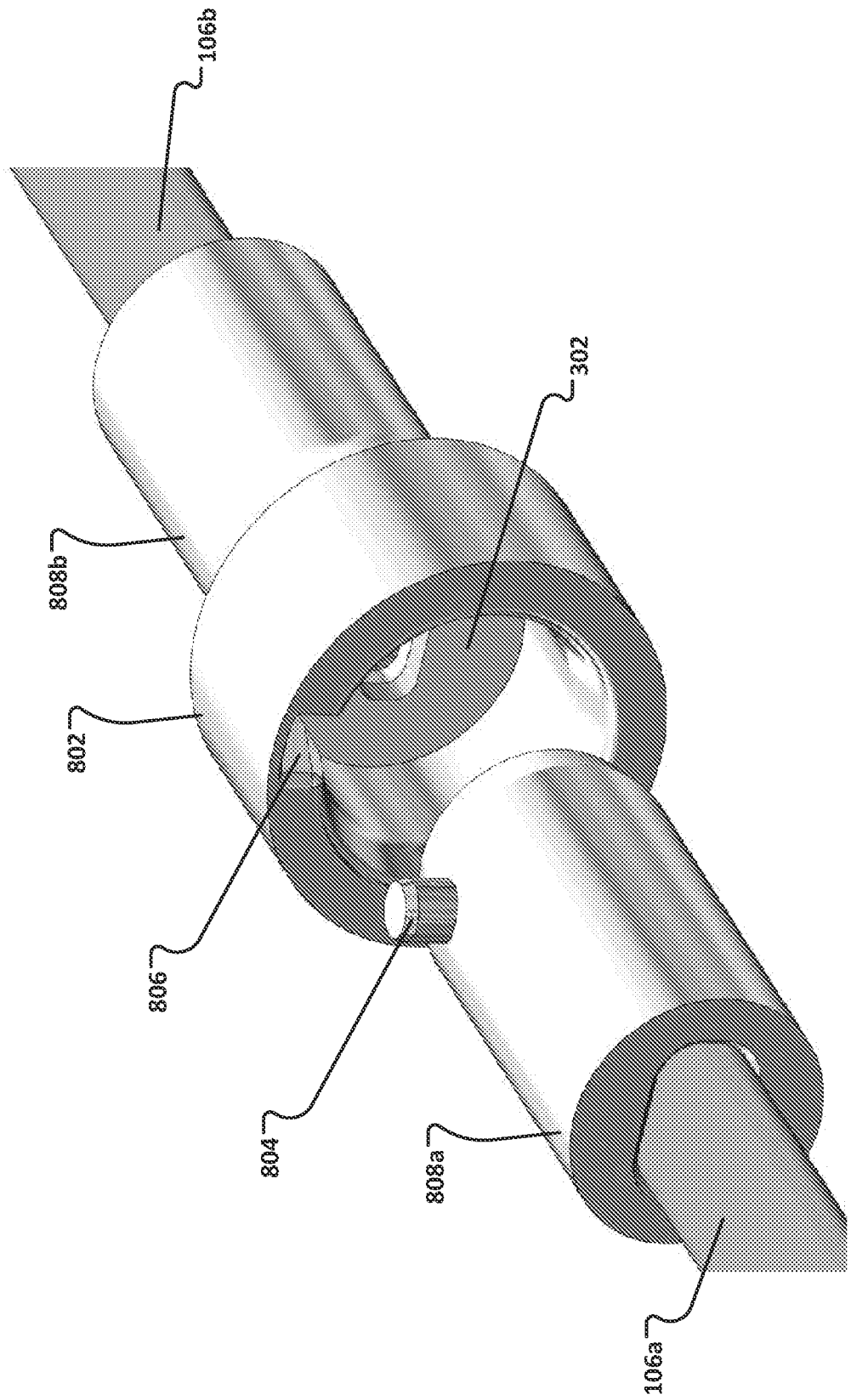
FIG. 8 is a perspective view of an example waveguide connector.

Referring FIG. 8, another example waveguide connector 802 is shown. Waveguide connector 802 is substantially the same as the waveguide connector of FIG. 4, except as otherwise shown and described herein. In particular, waveguide connector 802 includes a different self-alignment features on plug 808a and socket 808b. Connector 802 includes a self-alignment feature 804 on the plug 808a that is shaped like a cylindrical protrusion extending radially outward from the sidewall of plug 808a. Correspondingly, socket 808b includes a guide channel 806 which is sized and shaped to receive the self-alignment feature 804, while preventing axial rotation of the parts 808a, 808b. One advantage of the self-alignment feature 804 may be that the self-alignment feature is a simple cylindrical shape that may be easily created and added to the plug 808a using known manufacturing techniques.

Figure 9:
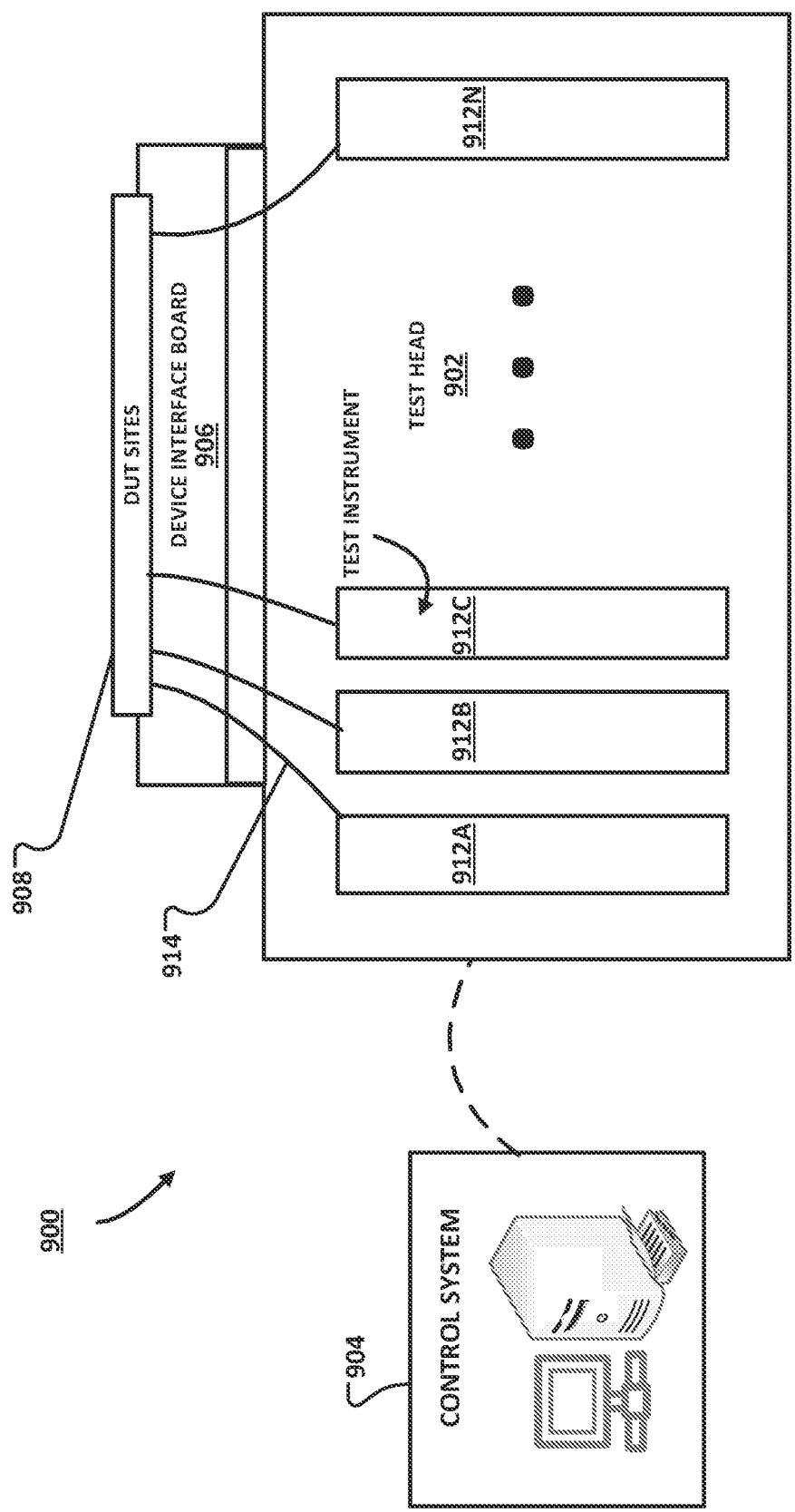
FIG. 9 is a block diagram of an example test system that may include a waveguide connector assembly like that of FIGS. 1 to 8.

The example waveguide connectors described herein may be used in a test system, such as automatic test equipment (ATE) 900 shown in FIG. 9. ATE 900 includes a test head 902 and a control system 904. The control system may include a computing system that includes one or more microprocessors or other appropriate processing devices as described herein. In FIG. 9, the dashed lines represent, conceptually, potential signal paths between components of the test system.

ATE 900 may include a printed circuit board (PCB) that holds devices to test. The PCB is a device interface board (DIB) 906. DIB 906 is connected to test head 902 directly or indirectly and includes mechanical and electrical interfaces to one or more devices under test (DUTs) that are being tested or are to be tested by ATE 900. To this end, DIB 906 includes sites 908, which may include pins, ball grid arrays (BGAs), conductive traces, or other points of electrical and mechanical connection to which the DUTs may connect. Test signals, response signals, voltage signals, and other signals pass through test channels over the sites between the DUTs and test instruments. DIB 906 may also include, among other things, connectors, conductive traces, and other electronic circuitry for routing signals between the test instruments, DUTs connected to sites 908, and other circuitry.

Control system 904 communicates with components of the test head 902 to control testing. For example, control system 904 may download test program sets to test instruments 912A, 912B, 912C, . . . and 912N (collectively referred to as 912) in test head 902. One or more of the test instruments 912 (not shown) may be external to the test head. Test instruments 912 include hardware devices that may include one or more processing devices and other circuitry, such as pattern generators, waveform generators, pin electronics, and/or parametric measurement units (PMUs). Test instruments 912 may run the test program sets to test DUTs in communication with the test instruments 912. Control system 904 may also send, to test instruments 912 in the test head 902, instructions, test data, and/or other information that are usable by the test instruments 912 to perform appropriate tests on DUTs interfaced to the DIB 906. The tests may be under different temperature conditions. In some implementations, this information may be sent via a computer or other type of network or via a direct electrical path. In some implementations, this information may be sent via a local area network (LAN) or a wide area network (WAN).

A test program generates a test flow (a set of instructions) to provide to the DUT. The test flow is written to output signals to elicit a response from the DUT, for example. The test flow may be written to output signals including radio frequency (RF) or other wireless signals, to receive responses to those signals from the DUTs, and to analyze the response to determine if a device passed or failed testing.

In some implementations, one or more of the test instruments 912 may be connected to the DIB 906 through a waveguide assembly 914 such as those described herein. Waveguides may be connected using a waveguide connector, examples of which include waveguide connectors 102 or 802 described herein. For example, test instrument 912A may emit an RF signal to the DIB 906, which may pass through a waveguide assembly 914, which may have the configuration shown in FIGS. 1 to 8. A waveguide connector 102 may reside at interface board 906 to connect to a first waveguide such as 106a along a path to the test instrument and a second waveguide such as 106b along a path to the DIB.

In some implementations, there is a first coaxial cable or other wired transmission line between the test instrument and the first waveguide; and there is a second coaxial cable or other wired transmission line between the DIB an the second waveguide. A first antenna system performs a conversion between transverse electro-magnetic (TEM) signals on the first coaxial cable or other wired transmission line and transverse electric (TE) waves on the first waveguide. A second antenna system performs a conversion between TEM signals on the second coaxial cable or other wired transmission line and TE waves on the second waveguide. In some implementations, waveguide connectors 102, 802 may also be used to complete connections between waveguides within the test head 902.

As noted, ATE 900 of FIG. 9 includes multiple test instruments 912, each of which may be configured, as appropriate, to perform one or more of testing and/or other functions. Although only four test instruments 912 are depicted, the system may include any appropriate number of test instruments, including those residing outside of test head 902. In some implementations, one or more test instruments 912 may be configured to output microwave, RF, or mm-wave wave signals to test a DUT based, e.g., on data provided by the control system, and to receive response signals from the DUT. Different test instruments 912 may be configured to perform different types of tests and/or be configured to test different DUTs. The received signals may include response signals that are based on the test signals and/or signals that originate from the DUT that are not prompted by (e.g., are not in response to) test signals. In some implementations, there may be coaxial cables and/or other signal transmission lines between the DUT, the DIB 906, and the test instrument interfaces over which test and response signals are sent.

Signals may be sent to, and received from, the DUT over multiple test channels. Each of these test channels may include one or more signal transmission lines or other wired or wireless transmission media. In some examples, a test channel may be defined by the physical transmission medium or media over which signals are sent from the test instrument 912 to a DUT and over which signals are received from the DUT. In some examples, a test channel may be defined by a range of frequencies over which signals are transmitted over one or more physical transmission media. A test channel may include conductive trace(s) on the DIB.

All or part of the test systems and processes described in this specification and their various modifications may be configured or controlled at least in part by one or more computers or computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the voltage source, the test system, and processes described herein can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A waveguide connector for making a blind-mate electrical connection between a first waveguide and a second waveguide, the waveguide connector comprising:
   a male part connected to the first waveguide, the first waveguide comprising a first conductive channel;
   a female part connected to the second waveguide, the second waveguide comprising a second conductive channel, the female part comprising a receptacle into which the male part slides to create the blind-mate electrical connection between the first conductive channel and the second conductive channel; and
   a self-alignment feature on at least one of the male part or the female part, the self-alignment feature to guide the male part into the receptacle while correcting for misalignment of the male part and the female part;
   wherein the male part comprises a substantially rectangular hollow cavity that is part of the first waveguide, the first waveguide having a substantially rectangular cross section; and
   wherein the female part comprises a substantially rectangular hollow cavity that is part of the second waveguide, the second waveguide having a substantially rectangular cross section.

2. A waveguide connector for making a blind-mate electrical connection between a first waveguide and a second waveguide, the waveguide connector comprising:
   a male part connected to the first waveguide, the first waveguide comprising a first conductive channel;
   a female part connected to the second waveguide, the second waveguide comprising a second conductive channel, the female part comprising a receptacle into which the male part slides to create the blind-mate electrical connection between the first conductive channel and the second conductive channel;
   a self-alignment feature on at least one of the male part or the female part, the self-alignment feature to guide the male part into the receptacle while correcting for misalignment of the male part and the female part; and
   a conductor between the male part and the female part to form an electrical connection between the first conductive channel and the second conductive channel.

3. The waveguide connector of claim 2, wherein the conductor comprises an electrically-conductive elastomeric material.

4. The waveguide connector of claim 2, wherein the conductor is substantially disk shaped and has a central opening configured to align with the first conductive channel and the second conductive channel.

5. The waveguide connector of claim 2, wherein the conductor comprises a compliant spring disk.

6. The waveguide connector of claim 2, further comprising:
   a first conductive joint to form an electrical connection between the male part and the first waveguide; and
   a second conductive joint to form an electrical connection between the female part and the second waveguide.

7. The waveguide connector of claim 2, wherein the first waveguide and the second waveguide are flexible and configured to bend in one or more dimensions.

8. The waveguide connector of claim 2, wherein the male part comprises a substantially circular hollow cavity that is part of the first waveguide, the first waveguide having a substantially circular cross section; and
   wherein the female part comprises a substantially circular hollow cavity that is part of the second waveguide, the second waveguide having a substantially circular cross section.

9. The waveguide connector of claim 2, wherein the self-alignment feature comprises:
   an alignment feature on the male part; and
   a guide channel on the female part, the guide channel being configured to receive the alignment feature.

10. The waveguide connector of claim 9, wherein the alignment feature and the guide channel are at a shared rotational angle around a central axis such that when the guide channel receives the alignment feature, a cross section of the first waveguide is rotationally aligned with a cross section of the second waveguide, the cross-section of the first waveguide and the cross-section of the second waveguide each being non-circular.

11. The waveguide connector of claim 2, wherein the male part and the female part are each formed of a conductive material.

12. A waveguide connector for making a blind-mate electrical connection between a first waveguide and a second waveguide, the waveguide connector comprising:
   a male part connected to the first waveguide, the first waveguide comprising a first conductive channel;
   a female part connected to the second waveguide, the second waveguide comprising a second conductive channel, the female part comprising a receptacle into which the male part slides to create the blind-mate electrical connection between the first conductive channel and the second conductive channel; and
   a self-alignment feature on at least one of the male part or the female part, the self-alignment feature to guide the male part into the receptacle while correcting for misalignment of the male part and the female part;
   wherein the male part and the female part each comprises a conductive material; and
   wherein the conductive material comprises one or more of silver-plated copper or gold-plated brass.

13. A waveguide connector for making a blind-mate electrical connection between a first waveguide and a second waveguide, the waveguide connector comprising:
 a male part connected to the first waveguide, the first waveguide comprising a first conductive channel;
 a female part connected to the second waveguide, the second waveguide comprising a second conductive channel, the female part comprising a receptacle into which the male part slides to create the blind-mate electrical connection between the first conductive channel and the second conductive channel;
 a self-alignment feature on at least one of the male part or the female part, the self-alignment feature to guide the male part into the receptacle while correcting for misalignment of the male part and the female part; and
 an alignment spring connected to the female part, the alignment spring being configured to contact the male part to cause the male part and female part to align as the blind-mate electrical connection is created.

14. A test system comprising:
 a device interface board (DIB) configured to hold devices under test (DUTs);
 test instruments including a radio frequency (RF) test instrument configured to send RF signals to one or more of the DUTs for testing;
 a first waveguide between the RF test instrument and the DIB;
 a second waveguide between the DIB and a DUT; and
 a connector for making a blind-mate electrical connection between the first waveguide and the second waveguide, at least part of the connector being mounted on the DIB, the connector comprising:
  a male part connected to the first waveguide, the first waveguide comprising a first conductive channel;
  a female part connected to the second waveguide, the second waveguide comprising a second conductive channel, the female part comprising a receptacle into which the male part slides to create the blind-mate electrical connection between the first conductive channel and the second conductive channel; and
  a self-alignment feature on at least one of the male part or the female part, the self-alignment feature to guide the male part into the receptacle while correcting for misalignment of male part and the female part.

15. The test system of claim 14, wherein the connector further comprises an alignment spring connected to the female part, the alignment spring being configured to contact the male part to cause the male part and female part to axially align as the blind-mate electrical connection is created.

16. The test system of claim 14, wherein the misalignment of the male part and the female part comprises at least one of:
 a pitch misalignment around a central axis of the first waveguide or second waveguide;
 a yaw misalignment around a central axis of the first waveguide or second waveguide; or
 a roll misalignment around a central axis of the first waveguide or second waveguide.

17. The test system of claim 14, wherein the system comprises a test head to hold the test instruments, the DIB being mounted to the test head, the blind-mate electrical connection being within the DIB.

18. The test system of claim 14, wherein the first waveguide and second waveguide are flexible and configured to bend in one or more dimensions.

19. The test system of claim 14, further comprising:
 a first coaxial cable to electrically connect the test instrument to the first waveguide, and a first antenna system to perform conversion between transverse electro-magnetic (TEM) signals on the first coaxial cable and transverse electric (TE) waves on the first waveguide; and
 a second coaxial cable to electrically connect the DUT to the second waveguide, and a second antenna system to perform conversion between TE waves on the second waveguide that are coupled from the first waveguide and TEM signals on the second coaxial cable.

20. The test system of claim 14, wherein the waveguide connector further comprises a conductor between the male part and the female part to form an electrical connection between the first conductive channel and the second conductive channel.

21. The test system of claim 20, wherein the conductor is substantially disk shaped and comprises a central opening configured to align with the first and second conductive channels.

22. The test system of claim 20, wherein the conductor comprises an electrically-conductive elastomeric material.

23. The test system of claim 22, wherein the conductor comprises a compliant spring disk.

24. The test system of claim 14, further comprising:
 a first conductive joint to form an electrical connection between the male part and the first waveguide; and
 a second conductive joint to form an electrical connection between the female part and the second waveguide.

25. The test system of claim 14, wherein the male part comprises a substantially rectangular hollow cavity that is part of the first waveguide, the first waveguide having a substantially rectangular cross section; and
 wherein the female part comprises a substantially rectangular hollow cavity that is part of the second waveguide, the second waveguide having a substantially rectangular cross section.

26. The test system of claim 14, wherein the self-alignment feature comprises:
 an alignment feature on the male part; and
 a guide channel on the female part, the guide channel being configured to receive the alignment feature.

27. The test system of claim 26, wherein the alignment feature and the guide channel are at a shared rotational angle around a central axis such that when the guide channel receives the alignment feature, a cross section of the first waveguide is rotationally aligned with a cross section of the second waveguide, the cross-section of the first waveguide and the cross-section of the second waveguide each being non-circular.

28. The test system of claim 14, wherein the male part comprises a substantially circular hollow cavity that is part of the first waveguide, the first waveguide having a substantially circular cross section; and
 wherein the female part comprises a substantially circular hollow cavity that is part of the second waveguide, the second waveguide having a substantially circular cross section.

29. The test system of claim 14, wherein the first waveguide and second waveguide are filled with a dielectric plastic material.

30. The test system of claim of claim 14, wherein the male part and the female part comprise a conductive material.

31. The test system of claim 30, wherein the conductive material comprises at least one of silver-plated copper or gold-plated brass.

* * * * *